United States Patent
Hegde

(10) Patent No.: US 8,703,001 B1
(45) Date of Patent: Apr. 22, 2014

(54) GRID ASSEMBLIES FOR USE IN ION BEAM ETCHING SYSTEMS AND METHODS OF UTILIZING THE GRID ASSEMBLIES

(75) Inventor: Hari Hegde, Fremont, CA (US)

(73) Assignee: Sarpangala Hari Harakeshava Hegde, San Jose, CA (US)

( * ) Notice: Subject to any disclaimer, the term of this patent is extended or adjusted under 35 U.S.C. 154(b) by 748 days.

(21) Appl. No.: 12/244,681

(22) Filed: Oct. 2, 2008

(51) Int. Cl.
*G01L 21/30* (2006.01)
*G01R 31/00* (2006.01)
*B44C 1/22* (2006.01)

(52) U.S. Cl.
USPC .............................................. 216/59; 216/67

(58) Field of Classification Search
USPC ...................................................... 216/59, 67
See application file for complete search history.

(56) References Cited

U.S. PATENT DOCUMENTS

| | | | |
|---|---|---|---|
| 4,123,316 A | 10/1978 | Tsuchimoto | |
| 4,401,054 A | 8/1983 | Matsuo et al. | |
| 4,844,775 A | 7/1989 | Keeble | |
| 4,859,908 A | 8/1989 | Yoshida et al. | |
| 4,990,229 A | 2/1991 | Campbell et al. | |
| 6,463,873 B1 | 10/2002 | Thwaites | |
| 7,034,285 B2 * | 4/2006 | Ichiki et al. | 250/251 |
| 7,163,602 B2 | 1/2007 | Ogle | |
| 2004/0222367 A1 * | 11/2004 | Ichiki et al. | 250/251 |
| 2004/0264044 A1 * | 12/2004 | Konishi et al. | 360/110 |
| 2006/0090999 A1 | 5/2006 | Hockley et al. | |

FOREIGN PATENT DOCUMENTS

EP    1143481 B1    6/2005

OTHER PUBLICATIONS

Tartz et al. (Review of Scientific Instruments, vol. 69, No. 2, (1998) pp. 1147-1149).*

* cited by examiner

*Primary Examiner* — Nadine Norton
*Assistant Examiner* — Mahmoud Dahimene
(74) *Attorney, Agent, or Firm* — IPSG, P.C., Intellectual Property Law

(57) ABSTRACT

A grid assembly for use in an etching system for etching at least a wafer. The grid assembly may include a first grid member, a second grid member, and a third grid member. When the grid assembly is used in etching the wafer, the first grid member may be electrically grounded, the second grid member may be electrically negative relative to the first grid member, and the third grid member may be electrically positive relative to the first grid member. The second grid member may be disposed between the first grid member and the third grid member. The first grid member may be thicker than at least one of the second grid member and the third grid member.

18 Claims, 6 Drawing Sheets

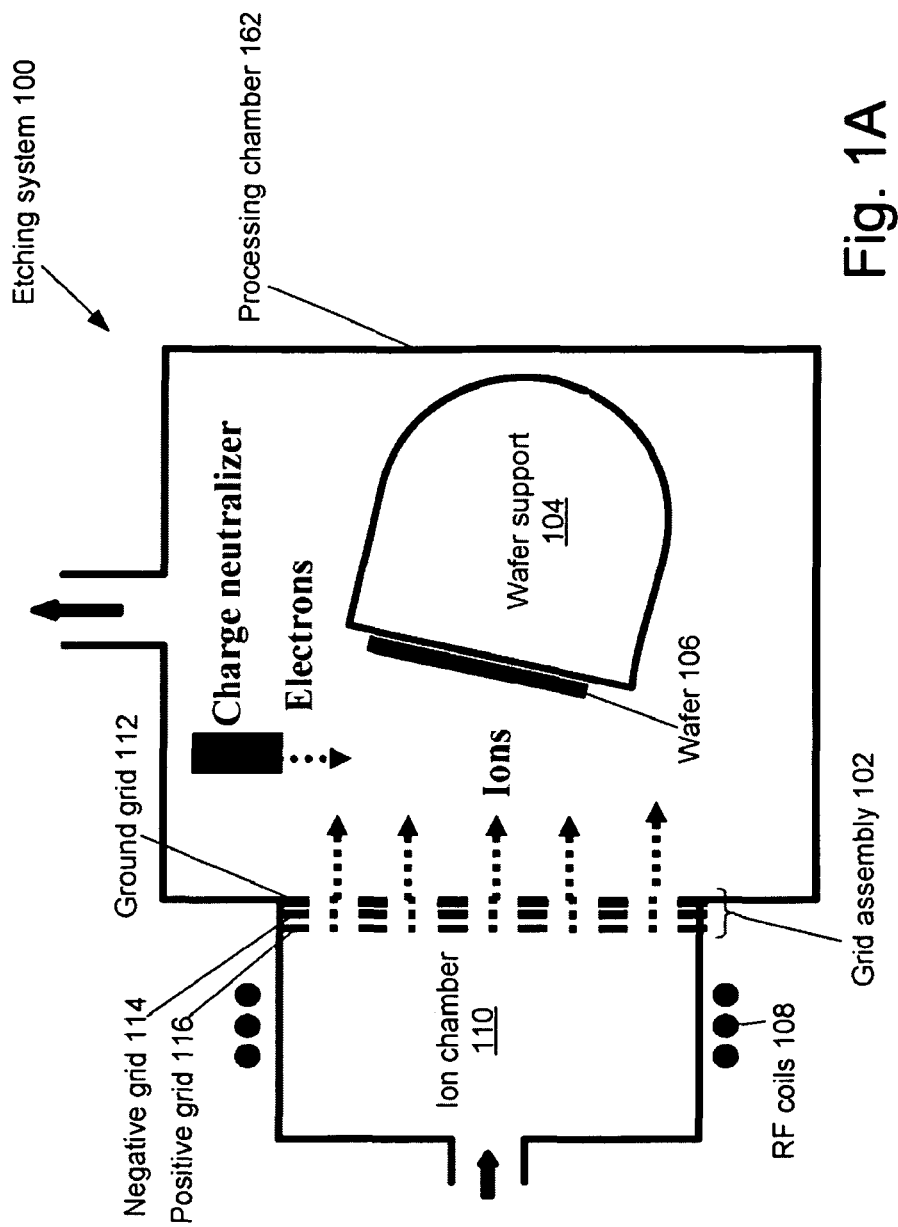

GRID ASSEMBLIES FOR USE IN ION BEAM ETCHING SYSTEMS AND METHODS OF UTILIZING THE GRID ASSEMBLIES

BACKGROUND OF THE INVENTION

Etching systems, such as ion beam etching systems, are employed in various industries for fabricating devices on wafers. The industries may include, for example, magnetic read/write and storage, optical system, semiconductor, and micro-electromechanical system (MEMS) industries.

An ion beam etching system typically includes a grid assembly disposed between an ion source unit and a wafer for providing a broad ion beam to etch the wafer. The ion beam may etch away unprotected/unwanted material from the wafer for forming particular device structures. A substantial amount of the unwanted material that is etched away from the wafer as well as the surrounding chamber wall areas exposed to the broad ion beam may sputter and adhere to the grid assembly. The deposition of the unwanted material on the grid assembly may introduce mechanical stress on the grid assembly, thereby causing the grid assembly to warp. The warping of the grid assembly may degrade the uniformity of the ion beam. As a result, the yield of device fabrication may be substantially reduced.

To maintain an acceptable yield, grid assemblies may need to be frequently replaced. However, the frequent replacement of the grid assemblies may undesirably incur material costs, labor costs, system down time, and waste of resource.

In etching larger wafers, ion beam uniformity across each wafer may be especially crucial for achieving a desirable fabrication yield. At the same time, more unwanted material may be etched away from wafers and sputtered on the grid assembly to cause warping of the grid assembly. As a result, the frequency of grid assembly replacement may need to be increased, and additional manufacturing costs may be incurred.

SUMMARY OF INVENTION

An embodiment of the present invention relates to a grid assembly for use in an etching system for etching at least a wafer. The grid assembly may include a first grid member having a first set of holes, a second grid member having a second set of holes, and a third grid member having a third set of holes. When the grid assembly is used in etching the wafer, the first grid member may be electrically grounded, the second grid member may be electrically negative relative to the first grid member, and the third grid member may be electrically positive relative to the first grid member. The second grid member may be disposed between the first grid member and the third grid member. The first grid member may be thicker than at least one of the second grid member and the third grid member.

The above summary relates to only one of the many embodiments of the invention disclosed herein and is not intended to limit the scope of the invention, which is set forth is the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

FIG. 1A shows a schematic representation illustrating a side cut-away view of an etching system, including a grid assembly, in accordance with one or more embodiments of the present invention.

DETAILED DESCRIPTION OF EMBODIMENTS

Figure 1B:
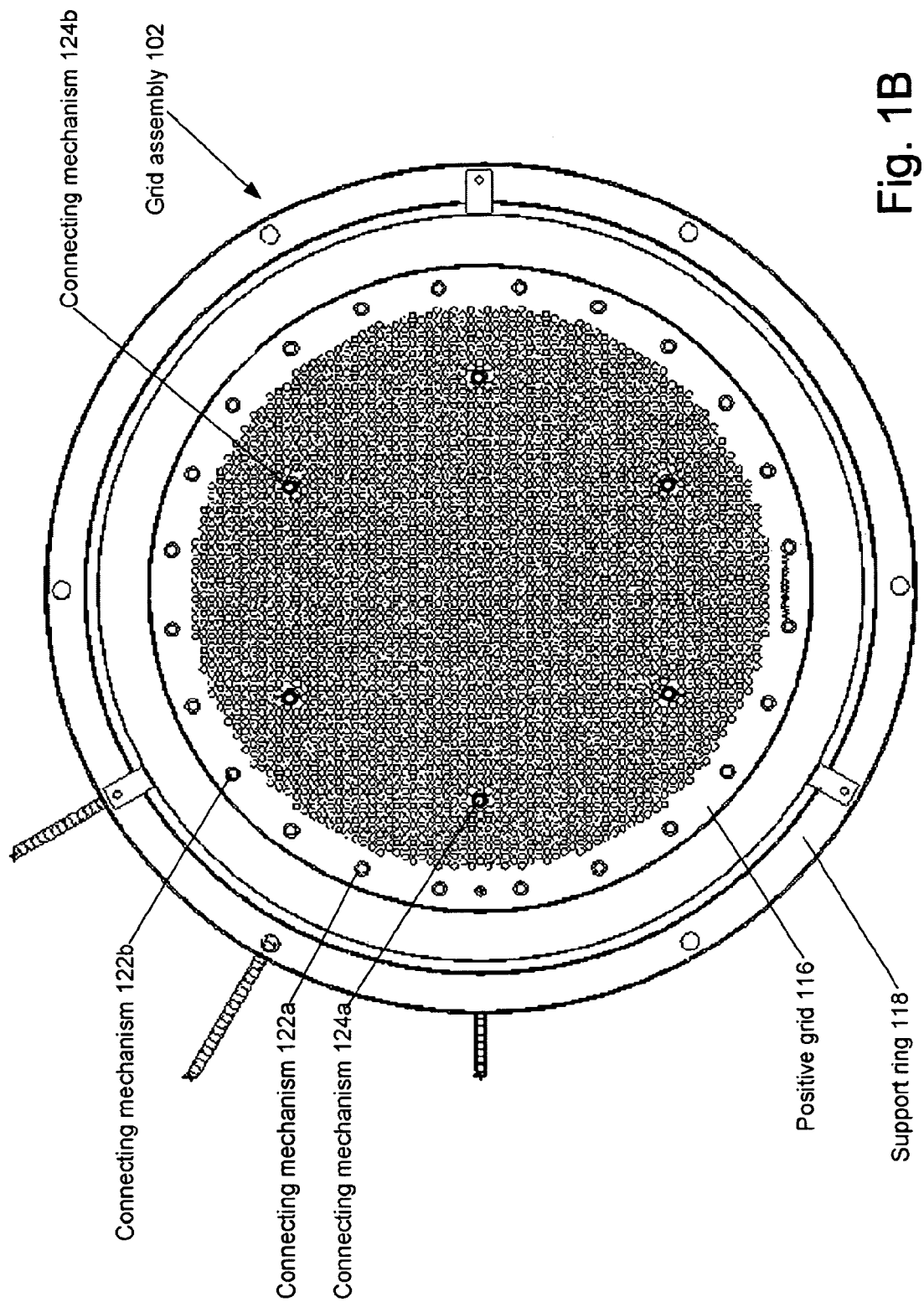
FIG. 1B shows a schematic representation illustrating a view of the grid assembly from the plasma side, in accordance with one or more embodiments of the present invention.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

One or more embodiments of the invention relate to a grid assembly for use in an etching system for etching at least a wafer. The grid assembly may include a first grid member (e.g., a ground grid member), a second grid member (e.g., a negative grid member), and a third grid member (e.g., a positive grid member), each including a set of holes for providing ions to etch the wafer. When the grid assembly is used in etching the wafer, the first grid member may be electrically grounded, the second grid member may be electrically negative relative to the first grid member, and the third grid member may be electrically positive relative to the first grid member.

Among the three grid members, the first grid member (e.g., the ground grid member) may be disposed closest to the wafer during etching the wafer. The second grid member (e.g., the negative grid member) may be disposed between the first grid member and the third grid member (e.g., the positive grid member), with a first space existing between the first grid member and the second grid member, and with a second space existing between the second grid member and the third grid member. The second space may be larger than the first space for achieving desirable etch uniformity and ion beam divergence in etching the wafer.

In one or more embodiments, ion beam current at each grid hole may be inversely proportional to the square of the distance between the second and third grid members. The second space (e.g., the space between the negative grid member and the positive grid member) may be configured relatively large such that small variations in the second space, for example, caused by warping of the grid assembly and/or deposition of sputtered waste material, may not cause significant ion beam current variation. As a result, ion beam uniformity may be substantially maintained, and the desirable etch uniformity may be achieved. The first space (e.g., the space between the ground grid member and the negative grid member) may be configured relatively small so that sufficiently low beam divergence, yet small enough ion beam impingement to the first grid may be achieved. The relatively small first space may also help maintain the structural robustness/rigidity of the grid assembly.

The first grid member (e.g., the ground grid member), which faces the wafer during the etching, may be subjected to more sputtered material than the other two grid members. In one or more embodiments, the first grid member may be made thicker than one or more of the other two grid members. The thicker first grid member may strengthen the structural robustness/rigidity of the grid assembly against potential warping, thereby advantageously helping maintain ion beam uniformity for achieving a satisfactory fabrication yield. The thickness of the first grid member may also improve durability of the first grid member, thereby lengthening the life of the grid assembly.

Being at least partially shielded by the first grid assembly against the sputtered waste material, the second grid member (e.g., the negative grid member) and the third grid member (e.g., the positive grid member) may be made relatively thin compared with the first grid. Being thinner, the second grid member may avoid releasing too much material that may contaminate the wafer when the grid members are subjected to grid-hole etching by ions. The thinner second grid member and third grid member may also help preserve sufficient sizes of the second space and the first space, thereby advantageously maintaining the ion beam uniformity.

One or more embodiments of the invention relate to an etching system that includes a grid assembly having one or more features discussed above. The etching system may advantageously provide desirable ion beam uniformity as well as satisfactory grid assembly utilization and durability, which may lead to a high fabrication yield and low costs.

One or more embodiments of the invention relate to a method for etching at least a first set of wafers and a second set of wafers that have different etching requirements. As an example, etching the first set of wafers may require higher ion beam uniformity than etching the second set of wafers.

The method may include providing an electrically negative grid member that is electrically negative relative to a reference and an electrically positive grid member that is electrically positive relative to the reference. The method may also include disposing the electrically negative grid member in a spaced-apart relationship with the electrically positive grid member such that a space exists between the electrically negative grid member and the electrically positive grid member.

The method may also include adjusting the space between the electrically negative grid member and the electrically positive grid member for reuse of at least the negative and positive grid members, thereby improving utilization of the grid members. For example, the method may include determining at least a first size and a second size for the space, wherein the first size is larger than the second size. The method may also include etching the first set of wafers with the space configured to have the relatively larger first size, for etching the first set of wafer with relatively higher ion beam uniformity. The method may also include monitoring etch uniformity across each wafer when etching the first set of wafers. The method may also include adjusting the space from having the first size to having the relatively smaller second size after the etch uniformity has decreased to a pre-determined threshold. The deterioration of the etch uniformity may be caused by, for example, deposition of contaminants and warping of grid members. The method may also include etching the second set of wafers with the space adjusted to the relatively smaller second size. Accordingly, the second set of wafer may be etched with a relatively higher etch rate.

The method may also include employing one or more additional grid members, for reuse of three, four, or more grid members in satisfying different manufacturing requirements. For example, the method may include providing an electrically grounded grid member to be the reference. The electrically negative grid member may be disposed between the electrically grounded grid member and the electrically positive grid member. In one or more embodiments, the electrically grounded grid member may be configured thicker than the negative grid member and/or the positive grid member to improve the overall structural robustness and/or rigidity of the assembly that includes the grid members.

As can be appreciated from the above description of the method, the grid members are not replaced or discarded once the etch uniformity deteriorate in etching the first set of wafers. Instead, with spacing being adjusted, the grid members are continued to be utilized for etching the second set of wafers that required less stringent uniformity of the ion beam. Advantageously, the utilization of the grid members may be substantially improved, and costs in fabricating devices may be substantially reduced. In contrast, prior-art techniques may require two sets of grid members for satisfying the different etching requirements in etching the two set of wafers and therefore may incur substantially higher costs.

The features and advantages of the present invention may be better understood with reference to the figures and discussions that follow.

FIG. 1A shows a schematic representation illustrating a side cut-away view of an etching system 100, including a grid assembly 102, in accordance with one or more embodiments of the present invention. Etching system 100 may also include a set of radio frequency coils 108, an ion chamber 110, a processing chamber 162, and a wafer support mechanism 104. Radio frequency coils 108 may excite gas in ion chamber 110 to generate ions (or charged particles). The ions may be provided through grid assembly 102 into processing chamber 162 for etching a wafer, such as wafer 106, which may be supported by wafer support mechanism 104.

Grid assembly 102 may include, for example, a ground grid member 112, a negative grid member 114, and a positive grid member 116, each including a set of holes for supplying the ions from ion chamber 110 to processing chamber 162. When grid assembly 102 is used in etching wafer 106, ground grid member 112 may be electrically grounded, negative grid member 114 may be electrically negative relative to ground grid member 112, and positive grid member 116 may be electrically positive relative to ground grid member 112. Among the three grid members, ground grid member 112 may be disposed closest to the wafer during etching the wafer, and negative grid member 114 may be disposed between ground grid member 112 and positive grid member 116. Ground grid 112 may be made thicker than negative grid member 114 and positive grid member 116 for reinforcing structural robustness/rigidity of grid assembly 102, and spacing between the grid members may be optimized for desirable etch uniformity and etch rate, as discussed with reference to the examples of FIGS. 1B-1D.

FIG. 1B shows a schematic representation illustrating a front view of grid assembly 102, as seen from ion chamber 110, in accordance with one or more embodiments of the present invention. In this front view, ground grid member 112 and negative grid member 114 (illustrated in the example of FIG. 1A) are hidden behind positive grid member 116. As illustrated in the example of FIG. 1D, grid assembly 102 may also include a support ring 118. Support ring 118 may be made of stainless steel may provide structural support for the grid members.

Grid assembly 102 may also include a set of connecting mechanisms, such as peripheral connecting mechanisms 122*a*-122*b* and inner connecting mechanisms 124*a*-124*b*. Support ring 118, ground grid member 112, negative grid member 114, and positive grid member 116 may be coupled with one another through one or more of the connecting mechanisms.

The connecting mechanisms may provide structural rigidity and robustness for grid assembly 102. However, stress exerted on ground grid member 112, such as stress caused by deposition of waste material etched away from a wafer, and resulted structural distortion might be substantially transmitted through the connecting mechanisms to negative grid member 114 and positive grid member 116 if ground grid member 112 were not properly strengthened. Embodiments of the invention may strengthen ground grid member 112 by providing a sufficient thickness for ground grid member 112, as further discussed with reference to the examples of FIGS. 1C-1D.

Figure 1C:
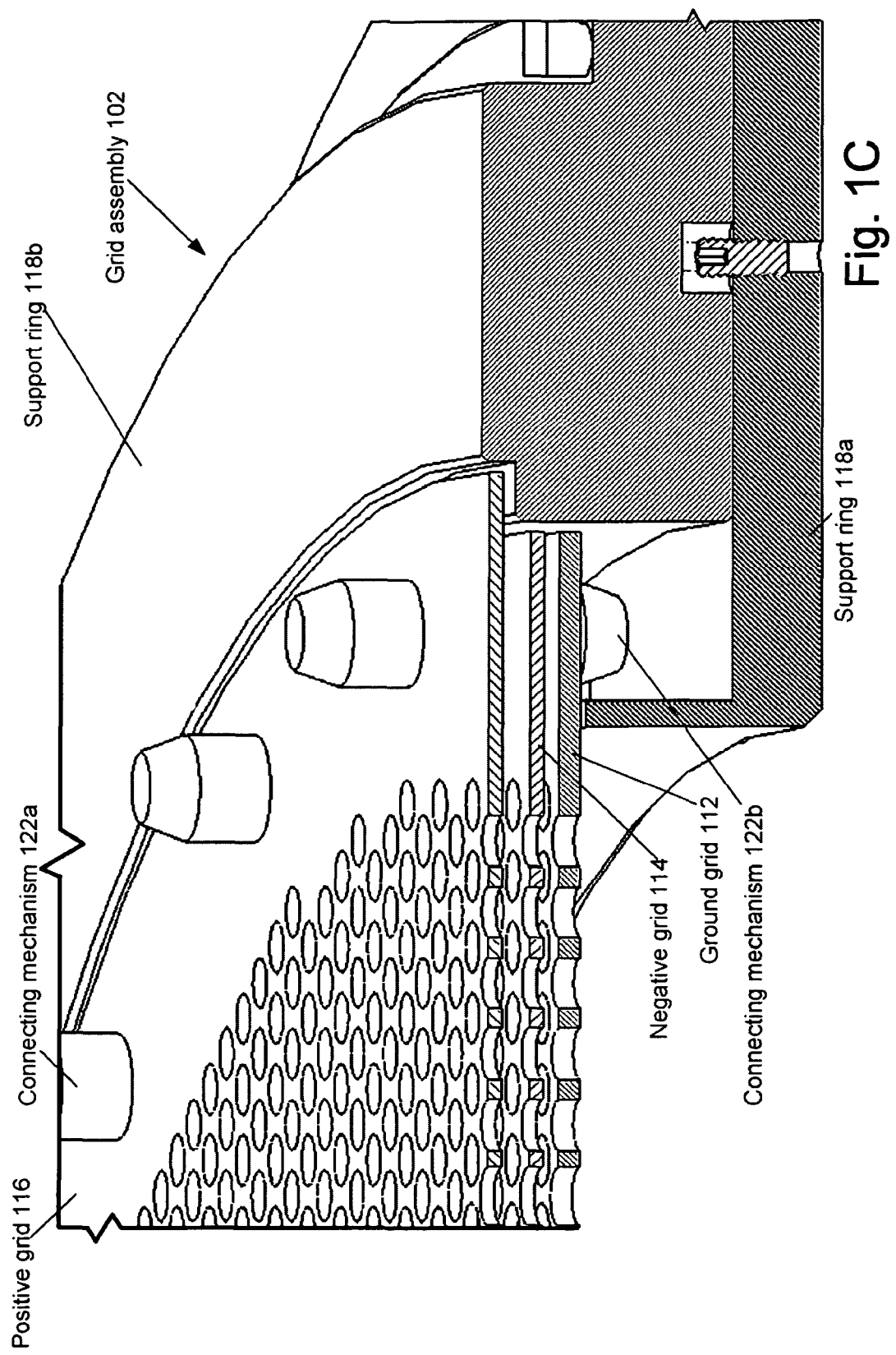
FIG. 1C shows a schematic representation illustrating a cut-away view of the grid assembly in accordance with one or more embodiments of the present invention.
Figure 1D:
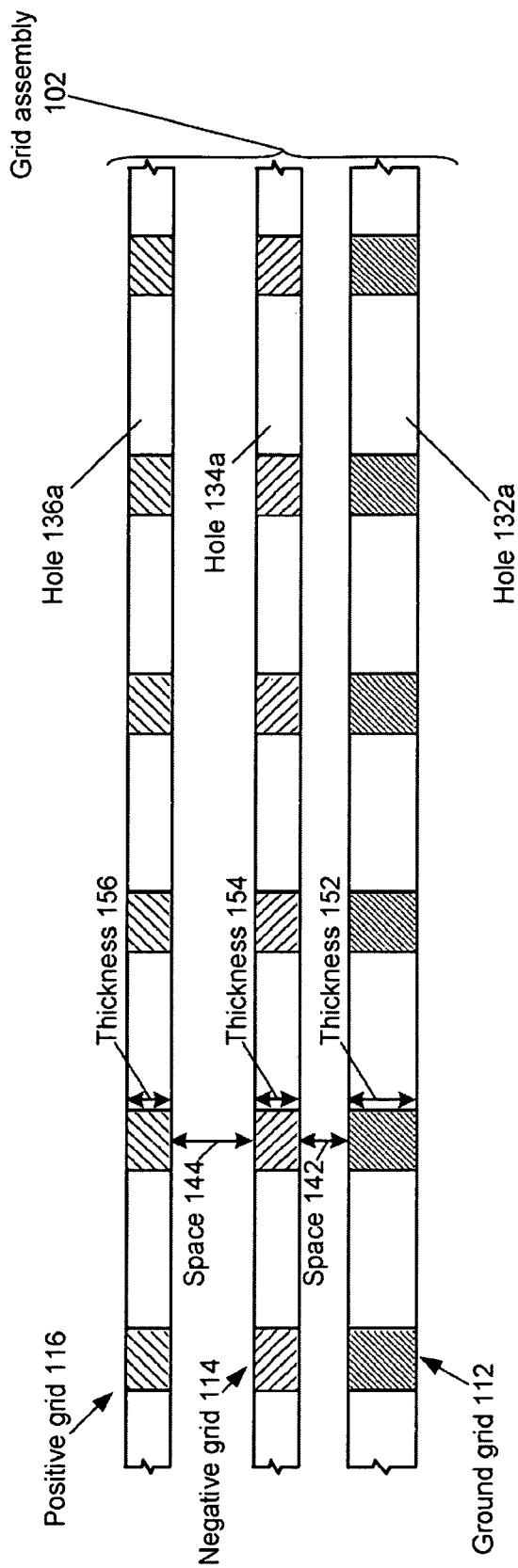
FIG. 1D shows a schematic representation illustrating a partial cross-sectional view of the grid assembly in accordance with one or more embodiments of the present invention.

FIG. 1C shows a schematic representation illustrating a cut-away view of grid assembly 102 in accordance with one or more embodiments of the present invention. As illustrated in the example of FIG. 1C, ground grid member 112, negative grid member 114, and positive grid member 116 may be coupled by, for example, at least connecting mechanisms 122*a*-122*b*. Connecting mechanisms 122*a*-122*b* may provide insulation between the grid members. At the same time, stress experience by any of the grid members might be transmitted through the connecting mechanisms if the grid members do not have sufficient strength.

Ground grid member 112 may be coupled with support ring 118*a* for receiving structural support. Support ring 118*a* and support ring 118*b* may represent two interconnected members of support ring 118 illustrated in the example of FIG. 1B. Support ring 118*b* is made of an electrically insulating material since portions of its body come in contact with the plasma. Alternatively or additionally, the ground grid may be mounted directly on the support ring 118*a*, since the support ring 118*a* may also be electrically neutral.

One or more of the connecting mechanisms, such as connecting mechanism 122*b*, may determine the size of the space between ground grid member 112 and negative grid member 114 and/or the size of the space between negative grid member 114 and positive grid member 116. The sizes of the spaces may be optimized to achieve desirable ion beam characteristics, thereby obtaining desirable etch uniformity and/or desirable etch rate, as further discussed with reference to FIGS. 1D and 2A-2B.

FIG. 1D shows a schematic representation illustrating a partial cross-sectional view of grid assembly 102 in accordance with one or more embodiments of the present invention. As illustrated in the example of FIG. 1D, a space 142 exists between ground grid member 112 and negative grid member 114, and a space 144 exists between negative grid member 114 and positive grid member 116. Space 142 (or the size thereof) and/or space 144 (or the size thereof) may be determined by one or more of the connecting mechanisms discussed above with reference to the examples of FIGS. 1B-1C.

In one or more embodiments, ion beam current at each grid hole (such as hole 132*a*, 134*a*, or 136*a*) of a grid member may be inversely proportional to the square of the distance between positive grid member 116 and negative grid member 114. For achieving desirable etch uniformity, space 144 may be made relatively large such that small variations in space 144, for example, caused by warping of a grid member and/or deposition of sputtered waste material, may not cause significant ion beam current variation. As an example, space 144 (or the width/size thereof) may be at least 0.055 inch, such as 0.07 inch. At the same time, an upper limit of space 144 may be provided to avoid compromising the etch rate. As an example, space 144 (or the width/size thereof) may be at most 0.110 inch. Advantageously, desirable ion beam uniformity, and therefore desirable etch uniformity, may be substantially maintained without the etch rate being compromised.

Additionally or alternatively, space 142 may be configured relatively small such that a sufficiently collimated beam current may be provided to maintain a desirable etch property. At the same time, space 142 may be made large enough such that the and that the ion beam intercepted by the first grid may still be acceptable for satisfying manufacturing requirements. As an example, space 142 (or the width/size thereof) may be at least 0.030 inch and at most 0.075 inch, such as 0.045 inch. The relatively small space 142 may also help maintain the structural robustness/rigidity of grid assembly 102.

Ground grid member 112, which faces the wafer during the etching, may be subjected to more sputtered waste material than the other two grid members. To resist the negative effects of the sputtered waste material, ground grid member 112 may be made thicker than one or more of the other two grid members. In other words, thickness 152 of ground grid member 112 may be larger than one or more of thickness 154 of negative grid member 114 and thickness 156 of positive grid member 116. The thicker ground grid member 112 may strengthen the structural robustness of grid assembly 102 against potential warping, thereby advantageously helping maintain ion beam uniformity for achieving a satisfactory fabrication yield. The thicker ground grid member 112 may also lengthen the life of grid assembly 102.

Being at least partially shielded by ground grid assembly 112 against the sputtered waste material, negative grid member 114 and positive grid member 116 may be made relatively thin (compared with ground grid member 112). Being thinner, negative grid member 114 and positive grid member 116 may avoid releasing too much material that may contaminate the wafer when the grid members are subjected to grid-hole etching by ions provided from ion chamber 110 (illustrated in the example of FIG. 1). The thinner negative grid member 114 and positive grid member 116 may also help preserve sufficient sizes of space 144 and space 142, for maintaining the etch uniformity.

Figure 2A:
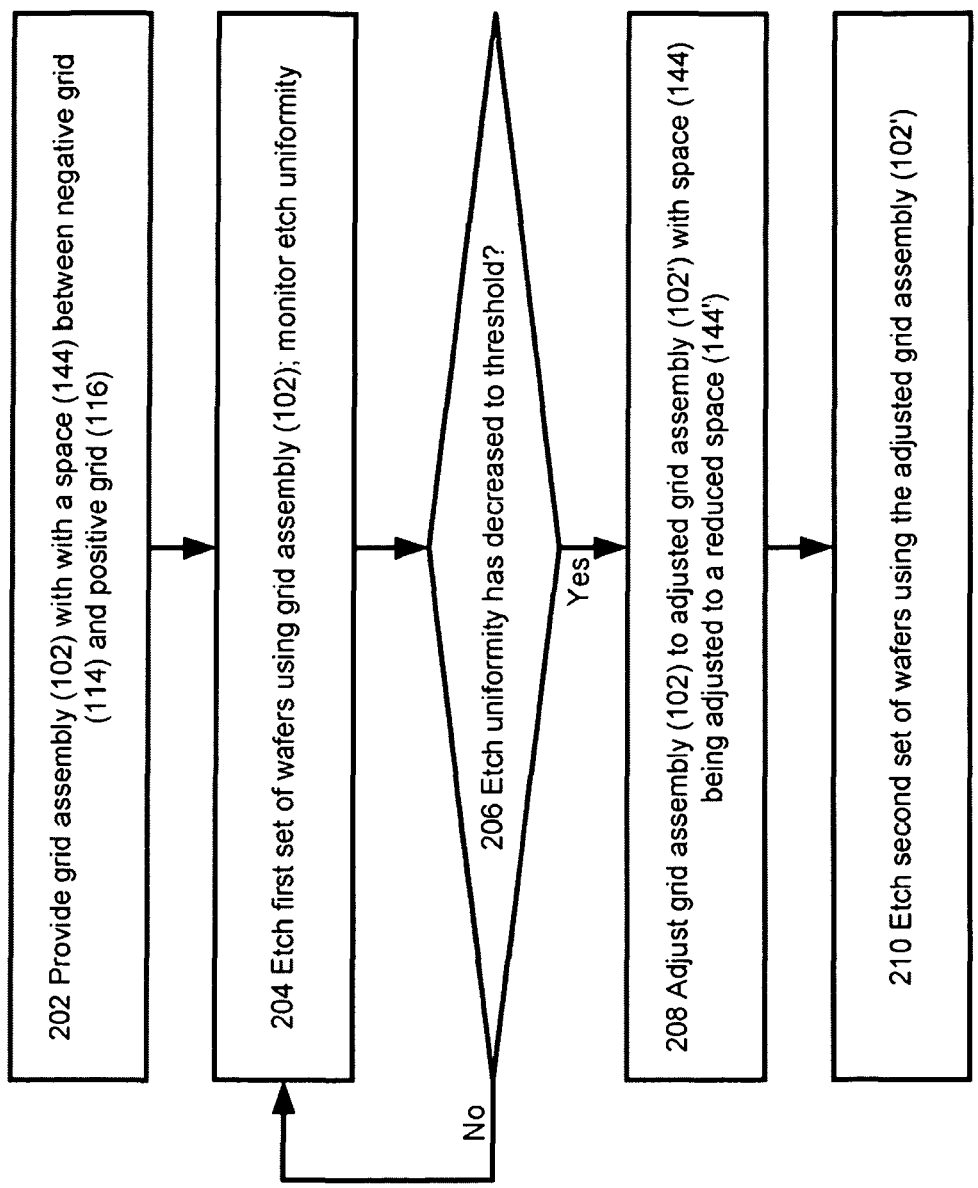
FIG. 2A shows a flowchart illustrating a method for utilizing grid members of the grid assembly with improved utilization in accordance with one or more embodiments of the present invention.

FIG. 2A shows a flowchart illustrating a method for utilizing grid members of a grid assembly, e.g., grid assembly 102, with improved utilization in accordance with one or more embodiments of the present invention. The method may start with step 202, in which grid assembly 102 may be provided in etching system 100 (illustrated in the example of FIG. 1A) with space 144 existing between negative grid 114 and positive grid 116. In addition, space 142 may exist between ground grid 112 and negative grid 114. In one or more embodiments, space 142 may be smaller than space 144.

In step 204, etching system 100 may etch a first set of wafers using grid assembly 102. The first set of wafers may require relatively high etch uniformity. A monitoring mechanism or an operator may monitor etch uniformity during the etching. The etch uniformity may be calculated using, for example, the standard deviation of etch rates at a set of sample locations on each of the wafers.

In step 206, the monitoring mechanism or the operator may determine whether the etch uniformity has decreased to a predetermined threshold. If the etch uniformity has not decreased to the threshold, control may be transferred to step 204, wherein etching system 100 may continue to etch one or more remaining wafers of the first set of wafers, and the monitoring mechanism or the operator may continue to monitor etch uniformity. If the etch uniformity has decreased to the threshold, control may be transferred to step 208.

In step 208, an adjustment mechanism (e.g., a robot) or an operator may adjust spacing in grid assembly 102 to result in adjusted grid assembly 102' with space 144 adjusted to a reduced space 144'. The adjustment may be performed by replacing one or more connecting mechanisms in grid assembly 102 with a different set of connecting mechanisms to replace space 144 with reduced space 144'. Alternatively or additionally, the adjustment may be performed by adjusting one or more connecting mechanisms in grid assembly 102. Adjusted grid assembly 102' and reduced space 144' are illustrated in the example of FIG. 2B.

Figure 2B:
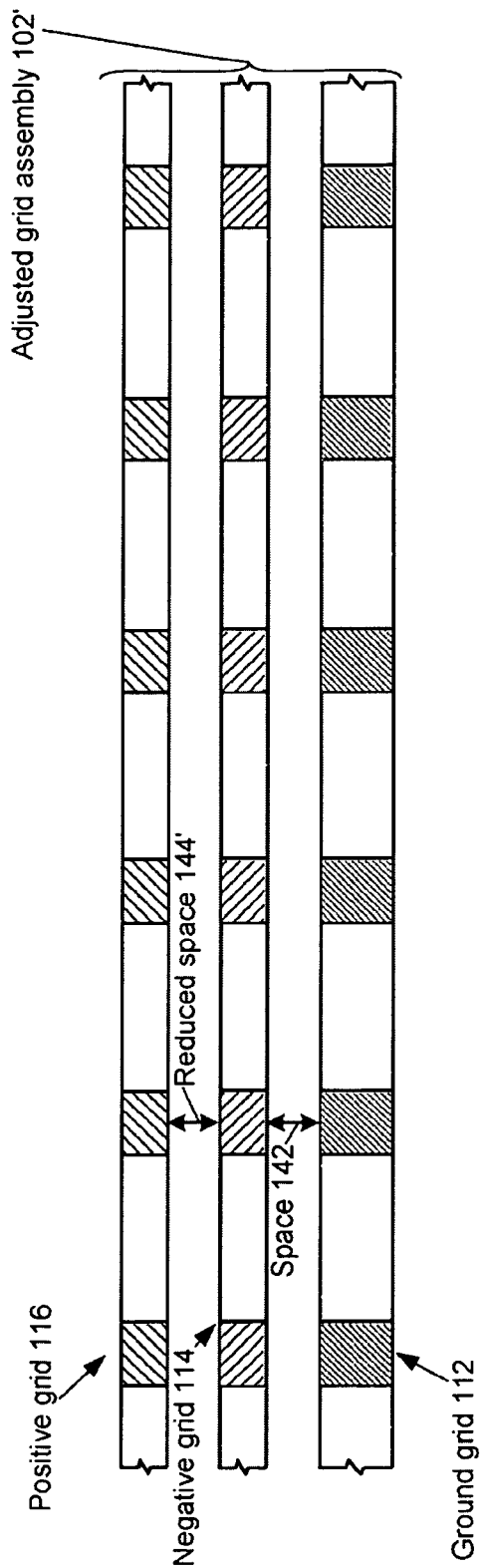
FIG. 2B shows a schematic representation illustrating a partial cross-sectional view of an adjusted grid assembly resulted from adjusting the grid assembly in accordance with one or more embodiments of the present invention.

FIG. 2B shows a schematic representation illustrating a partial cross-sectional view of adjusted grid assembly 102', resulted from adjusting and/or replacing connecting mechanisms in grid assembly 102, in accordance with one or more embodiments of the present invention. As illustrated in the example of FIG. 2B, adjusted grid assembly 102' may reuse one or more of ground grid member 112, negative grid member 114, and positive grid member 116 of grid assembly 102. With reduced space 144', adjusted grid assembly 102' may provide a higher etch rate.

Referring back to the example of FIG. 1A, in step 210, adjusted grid assembly 102' may be used in etching system 100 or another etching system for etching a second set of wafers that may require relatively lower etch uniformity than the first set of wafers. With adjusted grid assembly 102', a relatively high etch rate is provided in etching the second set of wafers, and therefore high productivity is achieved. Advantageously, the same set of ground grid member 112, negative grid member 114, and positive grid member 116 are utilized in satisfying at least two different sets of manufacturing requirements in processing two different sets of wafers.

As can be appreciated from the foregoing, embodiments of the present invention may strengthen structural robustness and/or rigidity of grid assemblies for use in etching systems without compromising the space between a negative grid member and a positive grid member of the grid assemblies. As a result, satisfactory grid assembly durability, etch stability, and etch uniformity may be provided. Advantageously, the costs associated with performing etching may be substantially reduced, and the fabrication yield may be improved.

Embodiments of the invention may also improve utilization of grid members of etching systems in satisfying different fabrication requirements. Advantageously, the costs for fabricating different devices may be further reduced.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A method for etching at least a first set of wafers and a second set of wafers, the method comprising:
   providing an electrically negative grid member that is electrically negative relative to a reference;
   providing an electrically positive grid member that is electrically positive relative to the reference;
   disposing the electrically negative grid member with respect to the electrically positive grid member such that a first space exists between the electrically negative grid member and the electrically positive grid member;
   providing an electrically grounded grid member to be the reference;
   configuring the electrically grounded grid member such that the ground grid member is thicker than at least one of the electrically negative grid member and the electrically positive grid member;
   disposing the electrically negative grid member between the electrically grounded grid member and the electrically positive grid member;
   determining a first size for the first space;
   etching the first set of wafers with the first space configured to have the first size, wherein the electrically negative grid member is maintained apart from the electrically positive grid member by a first plurality of insulating connecting mechanisms defining the first size while etching the first set of wafers with the first space configured to have the first size, at least a subset of the first plurality of insulating connecting mechanisms being disposed throughout an interior region of the electrically negative grid member;
   determining a second size for the first space; and
   etching the second set of wafers with the first space configured to have the second size, the first size being larger than the second size, the first set of wafers requiring higher etch uniformity than the second set of wafers, wherein the electrically negative grid member is maintained apart from the electrically positive grid member by a second plurality of insulating connecting mechanisms defining the second size, the second plurality of insulating connecting mechanism substituting for the first plurality of insulating connecting mechanisms while etching the first set of wafers with the first space configured to have the second size, at least a subset of the second plurality of insulating connecting mechanisms being disposed throughout the interior region of the electrically negative grid member,
   wherein the first space between the electrically negative grid member and the electrically positive grid member is greater in dimension than a second space between the electrically negative grid member and the electrically grounded grid member.

2. The method of claim 1, further comprising:
   monitoring etch uniformity when etching the first set or wafers; and
   adjusting the first space from having the first size to having the second size after the etch uniformity has decreased to a predetermined threshold,
   wherein the first set of wafers is etched before the second set of wafers is etched.

3. The method of claim 1 further comprising:
   monitoring etch uniformity when etching the first set of wafers; and replacing the first set of connecting mechanisms with the second set of connecting mechanisms when the etch uniformity decreases to a predetermined threshold.

4. The method of claim 1 wherein the first size is in a range of 0.055 inch to 0.110 inch, and the second size is a range of 0.030 inch to 0.075 inch.

5. The method or claim 1 further comprising configuring the electrically grounded grid member such that the ground grid member is thicker than both the electrically negative grid member and the electrically positive grid member.

6. A method for etching a first set of wafers, the method comprising:

providing an electrically grounded grid member;

providing an electrically negative grid member that is electrically negative relative to the grounded grid member; and providing an electrically positive grid member that is electrically positive relative to the grounded grid member, wherein a first space exists between the electrically negative grid member and the electrically positive grid member, wherein a second space exists between the electrically negative grid member and the electrically grounded grid member, wherein the electrically negative grid member is maintained apart from the electrically positive grid member by a first plurality of insulating connecting mechanisms having a first dimension that defines the first space, at least a subset of the first plurality of insulating connecting mechanisms being disposed throughout an interior region of the electrically negative grid member, wherein the electrically negative grid member is maintained apart from the electrically grounded grid member by a second plurality of insulating connecting mechanisms having a second dimension that defines the second space, at least a subset of the second plurality of insulating connecting mechanisms being disposed throughout an interior region of the electrically grounded grid member, wherein the first space has a greater dimension than the second space, and wherein the grounded grid member is thicker than at least one of the electrically negative grid member and the electrically positive grid member.

7. The method of claim 6 wherein the set of connecting mechanisms further determining at least a size of the first space.

8. The method of claim 6 wherein the electrically grounded grid member is thicker than both the electrically negative grid member and the electrically positive grid member.

9. The method of claim 6 wherein a width of the first space is at least 0.030 inch, and a width of the second space is at least 0.055 inch.

10. The method of claim 6 wherein a width of the second space is between 0.055 inch and 0.110 inch.

11. The method of claim 6 wherein the width of the first space is between 0.030 inch and 0.075 inch.

12. The method of claim 6 further including providing a wafer support mechanism for supporting a wafer of the first set of wafers, the electrically grounded grid member being disposed closer to the wafer support member than the electrically negative grid member, electrically negative grid member being disposed closer to the wafer support member than the electrically positive grid member.

13. The method of claim 12 further including providing an ion chamber for containing charged particles, the electrically grounded grid member, the electrically negative grid member, and the electrically positive grid member being disposed between the ion chamber and the wafer support mechanism.

14. The method of claim 13 further including providing a radio frequency coil for exciting gas in the ion chamber to generate ions for etching the first set of wafers.

15. The method of claim 14 wherein each of the electrically grounded grid member, the electrically negative grid member, and the electrically positive grid member include a second set of holes for allowing the ions to flow from the ion chamber into a processing chamber.

16. The method of claim 15 further including providing a support ring configured for providing structure support to at least one of the electrically grounded grid member, the electrically negative grid member, and the electrically positive grid member.

17. The method of claim 16 further including providing an adjustment mechanism for adjusting at least one of the first space and the second space by replacing the connecting mechanisms.

18. The method of claim 17 further including providing a monitoring mechanism for determining the etch uniformity during substrate processing.

* * * * *